US007550731B2

(12) United States Patent
Watanabe et al.

(10) Patent No.: US 7,550,731 B2
(45) Date of Patent: Jun. 23, 2009

(54) COVERSION APPARATUS AND IMAGING SYSTEM (75) Inventors: Minoru Watanabe, Honjo (JP); Chiori Mochizuki, Sagamihara (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 103 days.

(21) Appl. No.: 11/750,719

(22) Filed: May 18, 2007

(65) Prior Publication Data
US 2007/0295966 A1 Dec. 27, 2007

(30) Foreign Application Priority Data
Jun. 9, 2006 (JP) ............... 2006-161641

(51) Int. Cl.
*G01T 1/24* (2006.01)
*H01L 27/146* (2006.01)
(52) U.S. Cl. ............... 250/370.08; 250/370.09; 250/370.11; 250/370.14; 257/59; 257/431; 257/443; 257/448
(58) Field of Classification Search ................. 250/367, 250/370.09, 370.11, 370.14, 370.08; 257/59, 257/431, 443, 448
See application file for complete search history.

(56) References Cited

U.S. PATENT DOCUMENTS 5,917,199 A * 6/1999 Byun et al. ............... 257/59
6,847,039 B2 1/2005 Mochizuki ............. 250/370.09
7,259,037 B2 * 8/2007 Shih ........................ 438/55
2004/0065840 A1 * 4/2004 Morishita ............. 250/370.11
2006/0071251 A1 * 4/2006 Watanabe et al. ........... 257/291

FOREIGN PATENT DOCUMENTS

JP 2002-343952 11/2002

* cited by examiner

*Primary Examiner*—David P Porta
*Assistant Examiner*—Casey Bryant
(74) *Attorney, Agent, or Firm*—Fitzpatrick, Cella, Harper & Scinto (57) ABSTRACT A conversion apparatus includes a pixel region, on a substrate, including a plurality of pixels arranged in a matrix, with each pixel having a conversion element that converts radiation into electric charges, and a switching element. The switching element has a structure having a gate electrode, a first insulating layer, a second insulating layer, and a semiconductor layer from the substrate side in this order. The conversion element has an MIS-type structure of a bottom electrode arranged on an insulating layer extending from the first insulating layer of the switching element and being vertically higher than the gate electrode of the switching element, an insulating layer which is formed of the same layer as the second insulating layer of the switching element, and a semiconductor layer which is formed of the same layer as the semiconductor layer of the switching element from the substrate side in this order.

9 Claims, 8 Drawing Sheets

COVERSION APPARATUS AND IMAGING SYSTEM

BACKGROUND OF THE INVENTION

1. Field of the Invention

The present invention relates to a conversion apparatus and an imaging system.

2. Description of the Related Art

In recent years, the size of liquid crystal display panels has been increasing. The liquid crystal display panels contain switching elements such as thin film transistors (herein TFTs) fabricated on an insulating substrate. The manufacturing technology has been applied to large screen area sensors (conversion apparatuses) with conversion elements such as photoelectric conversion elements and switching elements and has been in practical use in fields such as radiation imaging apparatuses. The area sensor contains pixels arranged in a matrix and each pixel has a switching element and a conversion element. The representative conversion elements are: conversion elements which convert light from the arranged wavelength conversion layer, which converts radiation such as X-rays into light such as visible light into electric charges, and conversion elements with a semiconductor material which directly convert radiation into electric signals.

The conversion apparatuses used as radiation imaging apparatuses have evolved to have high-sensitivity conversion elements and high driving speed. High-sensitivity conversion elements can be achieved by increasing the area of the conversion elements. Thus, expansion of the area occupied by the conversion element in a pixel (corresponding to an aperture ratio) is required. In order to reduce the noise of the readout signal coming from the conversion element, it is necessary to increase the line width of signal lines and reduce the resistivity thereof. In order to increase the driving speed, it is necessary to increase the size of the switching elements. Further, it is necessary to increase the line width of the gate lines in order to reduce the line resistivity. Accordingly, there is a need to increase the aperture ratio of the pixel, the line width and the size of the conversion element such that high sensitivity and high speed are achieved.

Japanese Patent Laid-Open No. 2002-343952 discloses arranging an interlayer dielectric film between a gate line of a switching element and a lower electrode of a conversion element, and between the gate line of the switching element and a gate electrode of the switching element. This enables increasing the space between the gate line of the switching element and the conversion element, and increasing the aperture ratio by increasing the size of the conversion element in a pixel.

However, Japanese Patent Laid-Open No. 2002-343952 discloses arranging the same interlayer dielectric film between a gate line of a switching element and a lower electrode of a conversion element, and between the gate line of the switching element and a gate electrode of the switching element. Therefore, the characteristic of each element cannot be improved by individually designing the film thicknesses of the insulating film of the switching element and that of the conversion element.

SUMMARY OF THE INVENTION

The present invention is provided to improve the characteristics of a switching element and a conversion element constituting a pixel by individually designing the film thickness of the insulating film of each element.

According to the first aspect of the present invention, there is provided a conversion apparatus which comprises a pixel region, on a substrate, including a plurality of pixels arranged in a matrix, each pixel having a conversion element that converts radiation into electric signals and a switching element, wherein the switching element has a structure comprising a gate electrode, a first insulating layer, a second insulating layer and a semiconductor layer from the substrate side in this order, and the conversion element has a structure comprising a bottom electrode, the second insulating layer and a semiconductor layer on the first insulating layer from the substrate side in this order.

According to the second aspect of the present invention, there is provided an imaging system which comprises the above-described conversion apparatus, a signal-processing unit configured to process a signal from the conversion apparatus, a display unit configured to display a signal from the signal-processing unit, and a transmission-processing unit configured to transmit a signal from the signal-processing unit to the display unit.

Further features of the present invention will become apparent from the following description of exemplary embodiments with reference to the attached drawings.

DESCRIPTION OF THE EMBODIMENTS

With reference to the figures, exemplary embodiments of the invention will now be described. It should be appreciated that radiation may include, for example, X-rays, alpha rays, beta rays, gamma rays and light such as visible light and infrared light.

With reference to the figures, exemplary embodiments of the invention will now be described in detail. The exemplary embodiments are described primarily with reference to a radiation imaging apparatus, which converts radiation into electric signals. A wavelength conversion layer such as a scintillator may be arranged above a conversion element that converts radiation into visible light, which can be photoelectrically converted by the conversion element. The representative conversion element may be a direct conversion element that directly converts radiation such as X-rays, alpha rays, beta rays, and gamma rays into electrical signals (electrical charges).

First Embodiment

Figure 1:
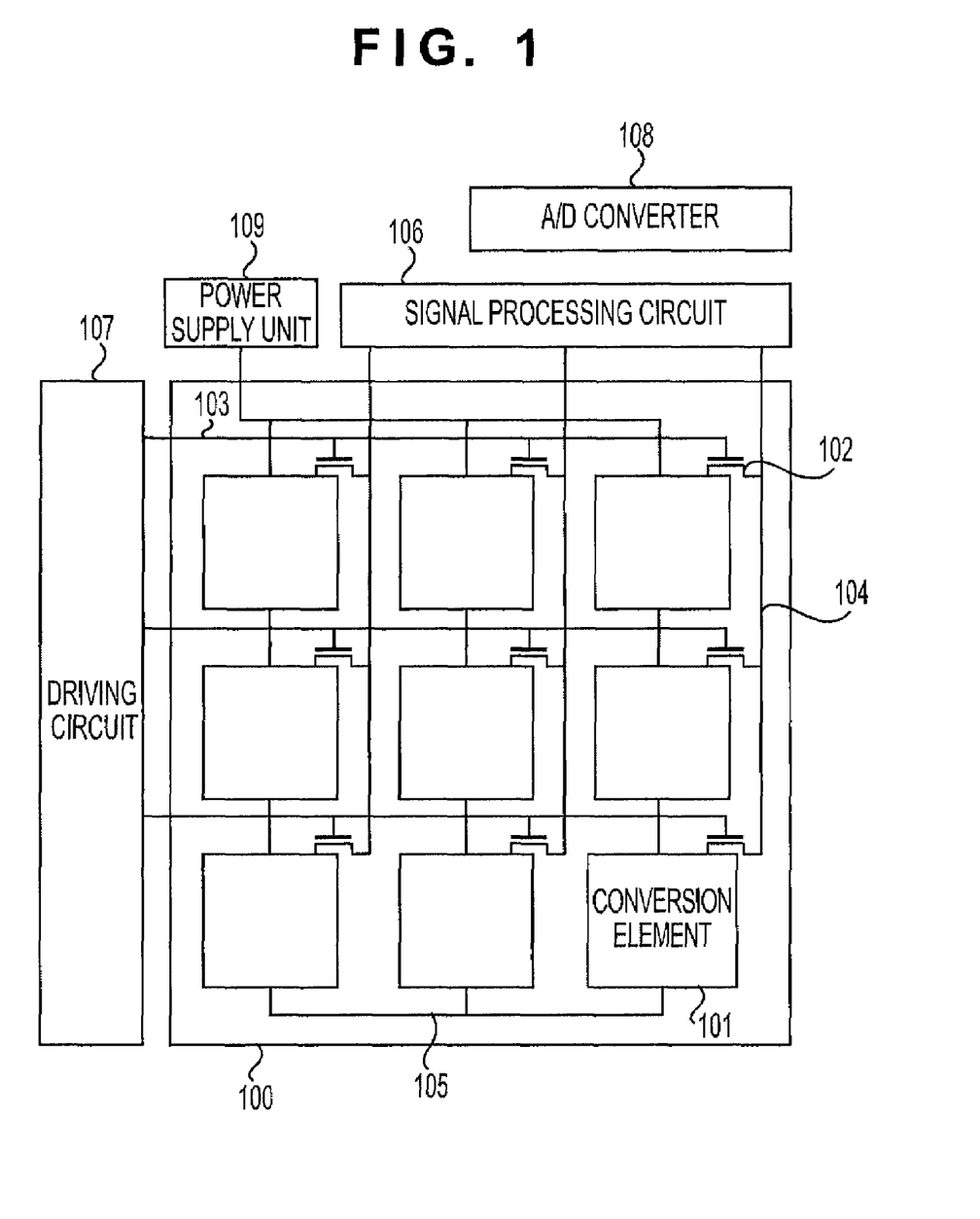
FIG. 1 is a schematic plan view of a conversion apparatus according to the preferred first embodiment of the present invention.

FIG. 1 is a plan view showing an example configuration of a conversion apparatus according to the preferred embodiment of the invention: conversion elements 101, which convert radiation into electric signals; switching elements 102 such as TFTs; gate lines 103; signal lines 104; bias lines 105; a signal-processing circuitry 106; a driving circuitry 107; an analog-to-digital (herein A/D) converter 108, a bias power supply unit 109. Each pixel has the conversion element 101 and the switching element 102. A plurality of the pixels, on an insulating substrate 100, are arranged in a matrix and constitute a pixel region.

The gate line 103 is connected to the gate electrodes of the switching elements 102 arranged in a row direction and driving signals from the driving circuitry 107 are applied to the switching elements 102. The signal lines 104 are connected to the source or drain electrodes of the switching elements 102 arranged in a column direction and signals based on electric charges, which are generated in the conversion elements 101, are transmitted by the switching element 102. The signals transmitted in parallel from the pixels are converted to serial signals. The serial signals are converted from analog signals to digital signals by the A/D converter 108 and are output. The bias power supply unit 109 is configured to supply a bias for converting radiation into electric signals by the conversion elements 101 and a bias for initializing the conversion elements 101. The bias power supply unit 109 is connected to one electrode of each conversion element 101 via a bias line 105.

Figure 2:
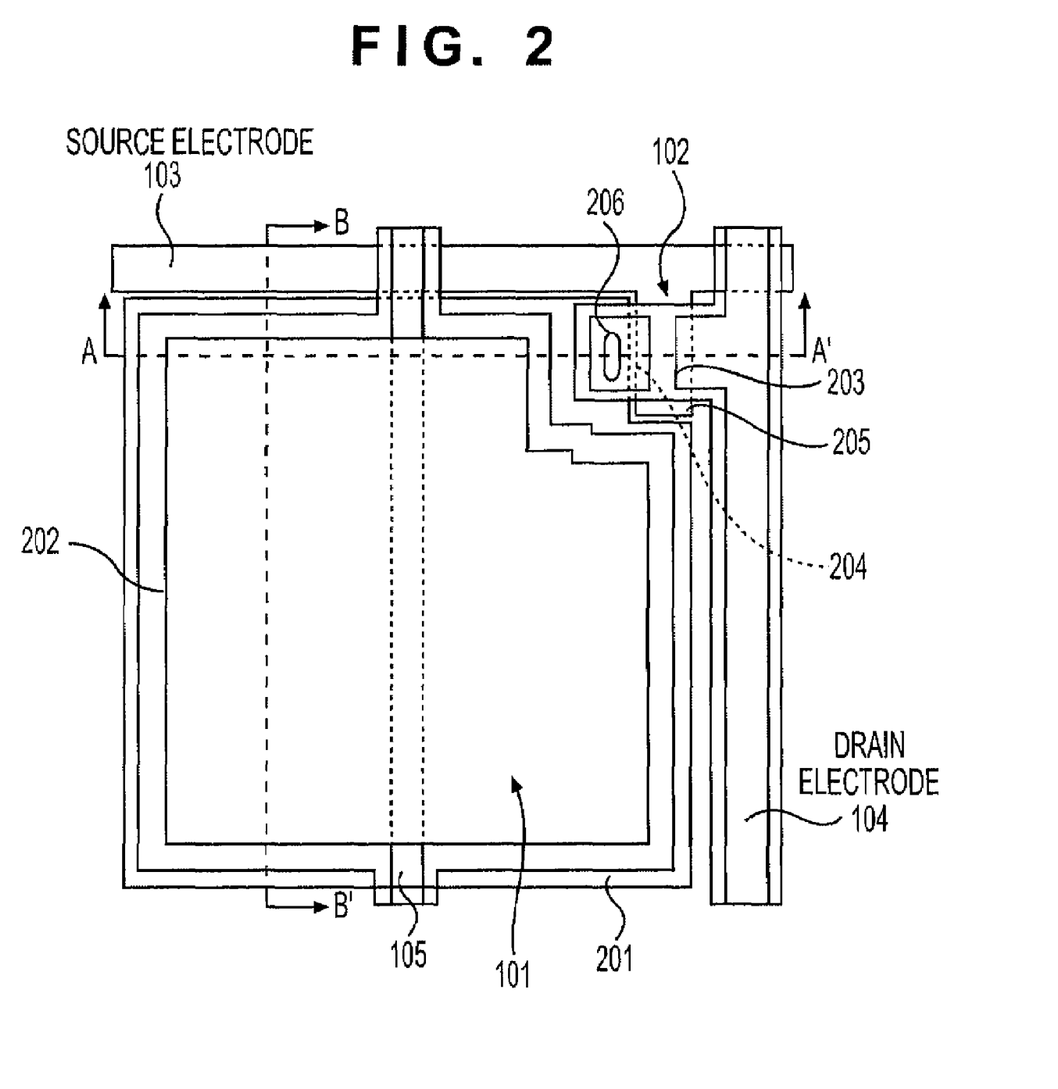
FIG. 2 is a schematic plan view of a pixel according to the preferred first embodiment of the present invention.

FIG. 2 is a schematic plan view of the pixel as illustrated in FIG. 1. The conversion element 101 includes a lower sensor electrode 201 and an upper sensor electrode 202. The switching element 102 has a bottom-gate structure and includes a source electrode 203, a drain electrode 204, and a gate electrode 205. The gate electrode 205 of the switching element 102 is connected to the gate line 103, which is connected to the driving circuitry 107. The source electrode 203 of the switching element 102 is connected to the signal line 104, which is connected to the signal-processing circuitry 106. The drain electrode 204 of the switching element 102 is connected to the lower sensor electrode 201 of the conversion element 101 via a through hole 206. The source electrode 203 and the drain electrode 204 may be reversed depending on the driving method and the device structure. The gate line 103 and the gate electrode 205 can be preferably formed by a metal film, which is different from that of the lower sensor electrode 201. An insulating layer to be described is arranged between the gate line 103 and the lower sensor electrode 201, and between the gate electrode 205 and the lower sensor electrode 201.

Figure 3:
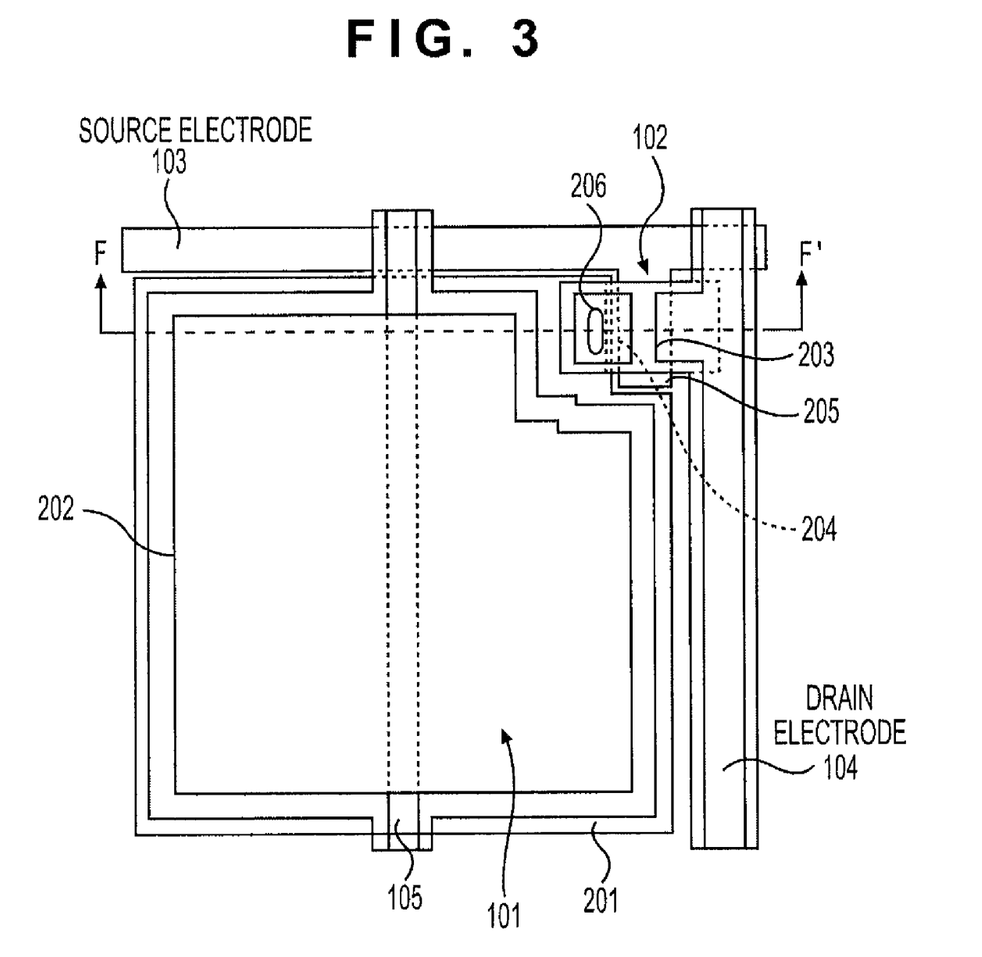
FIG. 3 is a schematic cross-sectional view along line A-A' of FIG. 2.

FIG. 3 is a schematic cross-sectional view along line A-A' of FIG. 2. The gate electrode 205 of the switching element 102 as illustrated in FIG. 2 is formed by a first metal layer. The lower sensor electrode 201 of the conversion element 101 is formed by a second metal layer. The metal layer is formed on the insulating substrate 100. A first insulating layer 301a is formed between the lower sensor electrode 201 and the gate electrode 205.

On the same side as the conversion element 101, a second insulating layer 302a, a semiconductor layer 303a, an impurity semiconductor layer 304, the bias line 105 and the upper sensor electrode 202 are sequentially formed on the lower sensor electrode 201. The semiconductor layer 303a is formed by a high resistivity semiconductor layer used as an active region. The upper sensor electrode 202, which is on the side of radiation incidence, can be preferably formed by a transparent electrode. Accordingly, the conversion element 101 comprises the lower sensor electrode 201, the second insulating layer 302a, the semiconductor layer 303a, the impurity semiconductor layer 304, the bias line 105 and the upper sensor electrode 202.

On the same side as the switching element 102, the second insulating layer 302a, the semiconductor layer 303a and the impurity semiconductor layer 304 used as an ohmic contact are sequentially formed on the first insulating layer 301a using the same process as the conversion element 101. The source electrode 203 and the drain electrode 204 are on the impurity semiconductor layer 304. The bias line 105, the source electrode 203, and the drain electrode 204 are formed by a third metal layer. The drain electrode 204 is connected to the lower sensor electrode 201 via the through hole 206. Accordingly, the switching element 102 comprises the gate electrode 205, the first insulating layer 301a, the second insulating layer 302a, the semiconductor layer 303a, the impurity semiconductor layer 304, the source electrode 203 and the drain electrode 204.

An insulating layer 305 protects the conversion element 101 and the switching element 102, and is formed onto the conversion element 101 and the switching element 102.

As described, the gate electrode 205 and the gate line 103 connected to the gate electrode 205 are formed by a layer, which is different from that of the lower sensor electrode 201. Thus, the size of the lower sensor electrode 201 and that of the area subjected to light or radiation can be increased. In addition, since the gate electrode 205 and the gate line 103 are formed by a layer, which is different from that of the lower sensor electrode 201, for example, the gate electrode 205 and the gate line 103 are not shorted out due to particle adhesion during photolithography. Therefore, the yield is increased.

The conversion element 101 is fabricated as an MIS structure where a metal layer, an insulating layer and a semiconductor layer are formed in this order. Using this structure, the processes can be simplified since the structure has the same structure as the switching element 102.

As shown in FIG. 3, the insulating layer used for the conversion element 101 has a one-layer structure with the second insulating layer 302a, while the insulating layer used for the switching element 102 has a two-layer structure with the first insulating layer 301a and the second insulating layer 302a. The insulating layer for the conversion element 101 has a one-layer structure so as to increase the output of carriers stored in the conversion element 101 having an MIS structure. The film thickness of the second insulating layer 302a of the conversion element 101 is, for example, reduced to the range of about 30-300 nm. The insulating layer for the switching element 102 has a two-layer structure so as to ensure the insulation properties of the switching element 102 with a high operating voltage by increasing a total film thickness of the first insulating layer 301a and the second insulating layer 302a of the switching element 102. The total film thickness of the first insulating layer 301a and the second insulating layer 302a is, for example, increased to the range of about 200-500 nm. Accordingly, the film thickness of the insulating layer for the conversion element 101 and that of the insulating layer for the switching element 102 are different, thereby enabling optimization of each element.

By increasing the film thickness of the insulating layer of the switching element 102, the film thickness of the insulating film of the intersection between the source electrode 203 and the gate line 103, and between the signal line 104 and the gate line 103 as illustrated in FIG. 2 can be increased, and the capacitance of the signal line can be reduced. Therefore, the noise of the conversion apparatus can be decreased.

Note that the first insulating layer 301a and the second insulating layer 302a may be fabricated as a multi-layer structure with a further plurality of insulating layers. In that case, the material of each insulating layer may be the same or different.

According to the experiment by the inventor, the deposition temperature of the silicon series film of the switching element 102 to be deposited could not be increased after aluminum with a low resistivity was used for the gate electrode 205 so as to decrease the resistivity of the gate line 103. Accordingly, the dynamic resistance of the switching element 102 was increased, and the switching element 102 which could drive at high speed could not be fabricated. Therefore, aluminum could not be used as the material of the gate line 103. On the other hand, at least only the first insulating layer 301a was fabricated below the allowable temperature limit. In that case, the first insulating layer 301a formed at a low temperature prevented the hillock of the gate line 103 formed by aluminum even though the second insulating layer 302a, the semiconductor layer 303a and the impurity semiconductor layer 304 were formed at a high temperature. This enabled the use of aluminum as the material for the first metal layer. The resistivity of the gate line 103 was decreased, and the driving speed of the switching element 102 was increased due to the small time constant of the line. In addition, the artifact and the noise due to the resistivity of the conversion element 101 and the gate line 103, and the time constant of the gate line 103 could be decreased.

The film thickness of the semiconductor layer 303a as illustrated in FIG. 3 affects both characteristics of the conversion element 101 with an MIS structure and the switching element 102. Thus, the film thickness of the switching element 102 and that of the conversion element 101 can be balanced and optimized when the film thickness of the second insulating layer 302a is decreased. The upper sensor electrode 202 is not necessarily arranged when the resistivity of the impurity semiconductor layer 304 is small. The position of the upper sensor electrode 202 may be under the source electrode 203 and the drain electrode 204 as illustrated in FIG. 3.

It is necessary to connect the gate line 103 to the leading line arranged at the periphery of the pixel region via the through hole arranged at the periphery of the pixel region in order to connect the gate line 103 to the driving circuitry 107. This connection can be achieved by forming the through hole concurrently at the periphery of the pixel region and performing overetching so as to perform etching to the first insulating layer 301a when forming the through hole 206 as illustrated in FIG. 3. Then, for example, the gate line 103 may be connected to the outgoing line formed by the third metal layer.

Figure 4:
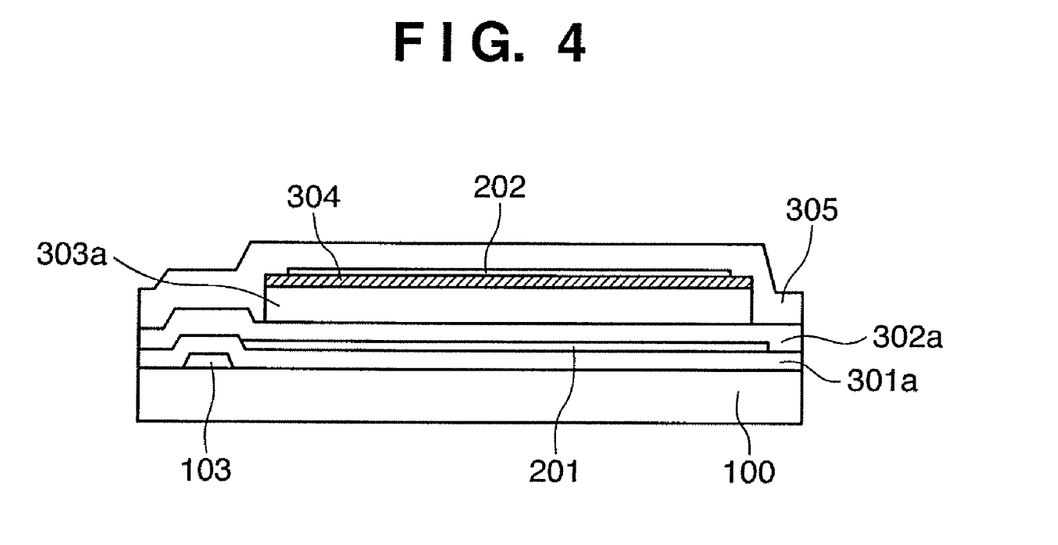
FIG. 4 is a schematic cross-sectional view along line B-B' of FIG. 2.

FIG. 4 is a schematic cross-sectional view along line B-B' of FIG. 2. The gate line 103 and the lower sensor electrode 201 may be closely arranged so as not to overlap each other in the horizontal direction. For example, the size of the area subjected to light or radiation can be increased to the degree that the space in the horizontal direction reaches substantially 0.

In fact, it is possible to overlap the gate line 103 and the lower sensor electrode 201 in the horizontal direction in order to increase the aperture ratio, since there exists the first insulating layer 301a between the gate line 103 and the lower sensor electrode 201. In that case, the capacitance and the time constant of the gate line 103 are increased. As a result, the driving speed becomes slow. Thus, the overlap may be performed so as not to cause the deterioration of the driving speed to become problematic.

As described, the gate line and the gate electrode of the switching element are formed by a layer, which is different from that of the lower sensor electrode of the conversion element. Thus, the characteristics of the switching element and the conversion element can be optimized. By using the structure disclosed in Japanese Patent Laid-Open No. 2002-343952, the gate line and the gate electrode of the switching element must be connected via a through hole. However, according to the preferred embodiment of the present invention, this process can be omitted, and the size of the area subjected to light or radiation can be increased together with the simplified process of the conversion element. In addition, by using the different metal layer, the rate of incidence of the short during photolithography is decreased, and the low resistivity due to the applicability of aluminum to the gate line is achieved.

Second Embodiment

Figure 5:
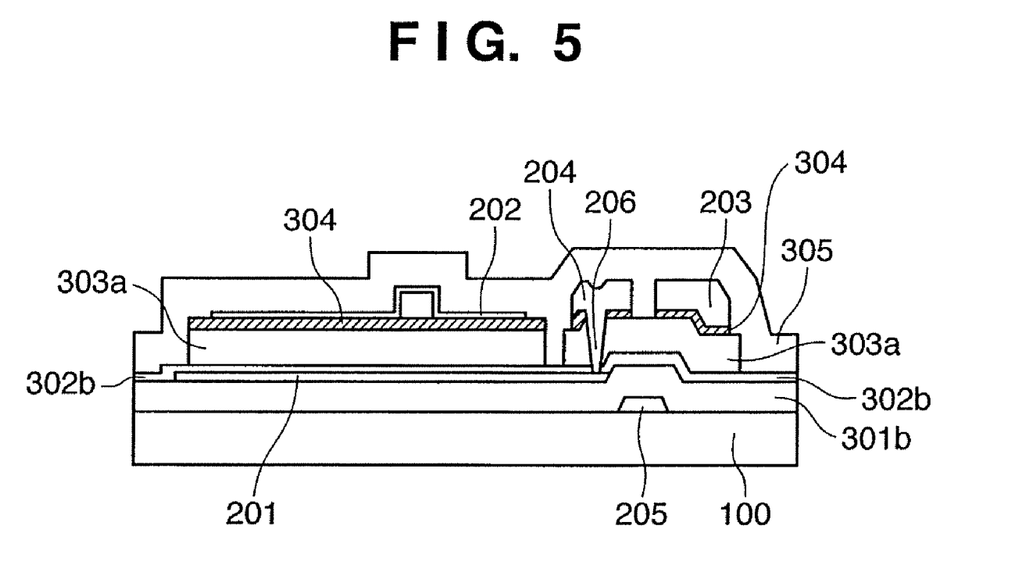
FIG. 5 is a schematic cross-sectional view of a pixel along line A-A' of FIG. 2 according to the preferred second embodiment of the present invention.

FIG. 5 is a schematic cross-sectional view of a pixel along line A-A' of FIG. 2 according to the preferred second embodiment of the present invention. The second embodiment differs from the first embodiment of FIG. 3 in that the ratio of the film thickness of first insulating layer to that of the second insulating layer is different. Under ordinary circumstances, for both the switching element 102 and the conversion element 101, the characteristics are improved as the film thicknesses of the insulating layers are decreased. However, the dielectric breakdown voltage is decreased as the film thicknesses of the insulating layers are decreased. Therefore, the insulating layer of the switching element 102, which has the thick gate electrode 205 to decrease the resistivity, is thickly formed to provide good insulation properties as illustrated in FIG. 5. The insulating layer of the conversion element 101, which uses the thin lower sensor electrode 201 for the reason that it is not necessary to decrease the resistivity, is thinly formed. This structure is preferable in that the characteristics of the switching element and the conversion element are improved. This is achieved by forming the first insulating layer 301b to be thicker than the second insulating layer 302b. The insulating layer 301b may be formed below the allowable temperature limit, and the second insulating layer may be formed at high temperature. This enables the use of aluminum with low resistivity as the material for the first metal layer. The interface between the second insulating layer 302b and the semiconductor layer 303a located at the channel region, which is important for the switching element 102, can be improved. As a result, both the switching element 102 and the conversion element 101 are optimized. The switching element 102 and the conversion element 101 are optimized if the film thickness of the first insulating layer 301b is, for example, about 250 nm-350 nm, and the film thickness of the second insulating layer 302b is, for example, about 30 nm-200 nm.

The reliability may be degraded due to the leakage of the thin insulating film when the film thickness of the lower sensor electrode 201 is thick or the control of the taper angle is not possible. Consequently, it is preferable that the film thickness of the lower sensor electrode 201 is thinly formed to be, for example, 10 nm-100 nm. In addition, the thinner insulating layer of the conversion element 101 can be formed by controlling the taper angle at a small degree ranging from 20° to 60° and improving the film coverage of the second insulating layer 302b.

Third Embodiment

Figure 6:
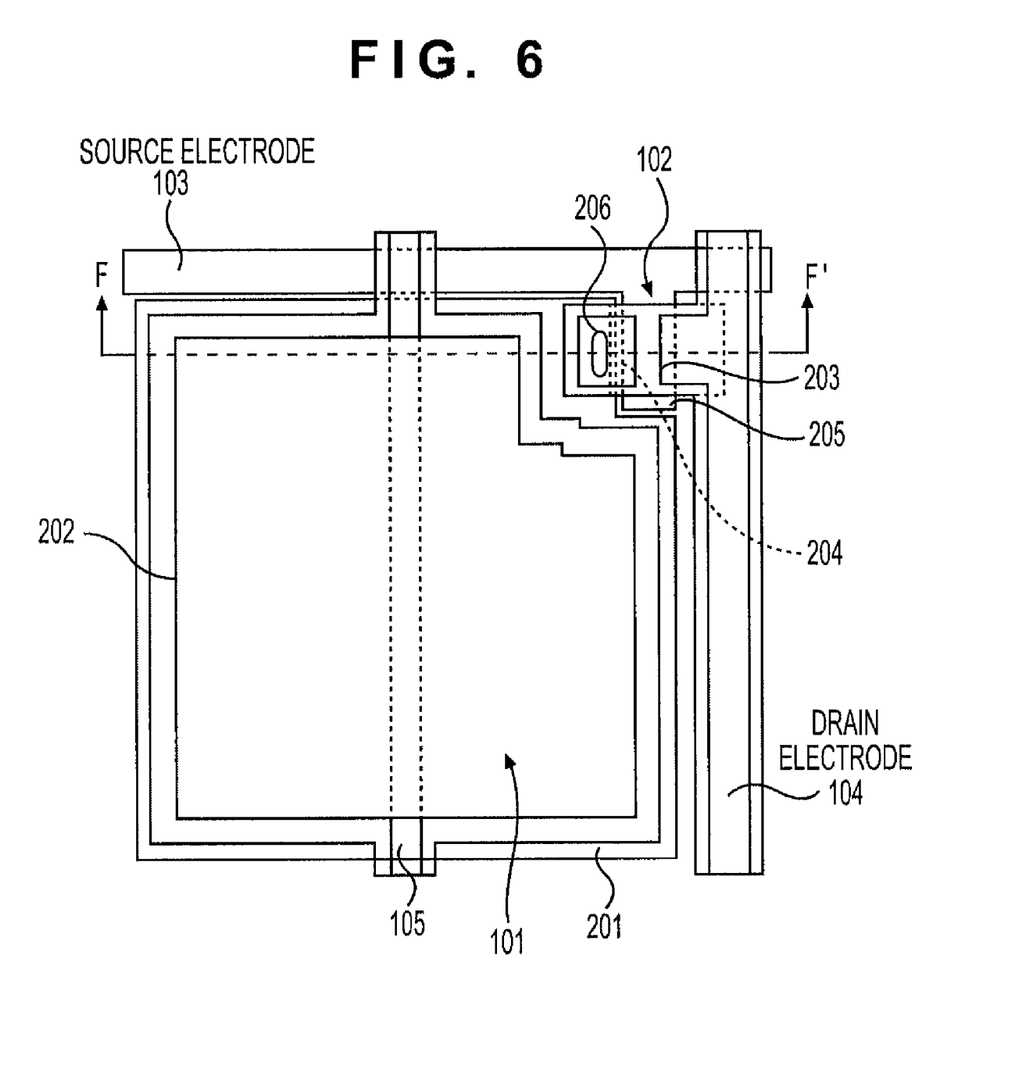
FIG. 6 is a schematic plan view of a pixel according to the preferred third embodiment of the present invention.

FIG. 6 is a schematic plan view of the pixel according to the preferred third embodiment of the present invention. The third embodiment differs from the first embodiment of FIG. 2 in that a part of the semiconductor layer arranged between or below the source electrode 203 and the drain electrode 204 of the switching element 102 is etched out. This allows the film thickness of the semiconductor layer at the channel region of the switching element 102 to be thinner than that of the semiconductor layer of the conversion element 101. The transfer ability is increased as the film thickness of the semiconductor layer of the switching element 102 is decreased. On the other hand, particularly in the case of an MIS structure, the readout efficiency of the stored carriers improves as the film thickness of the semiconductor layer is increased. Therefore, the film thicknesses of the insulating layer and the semiconductor layer of the switching element and the conversion element can be optimized by adding the etching process. As a result, the transfer ability is improved by forming the thicker semiconductor layer of the conversion element to facilitate the absorption of radiation and visible light and forming the thinner semiconductor layer of the switching element 102.

Figure 7:
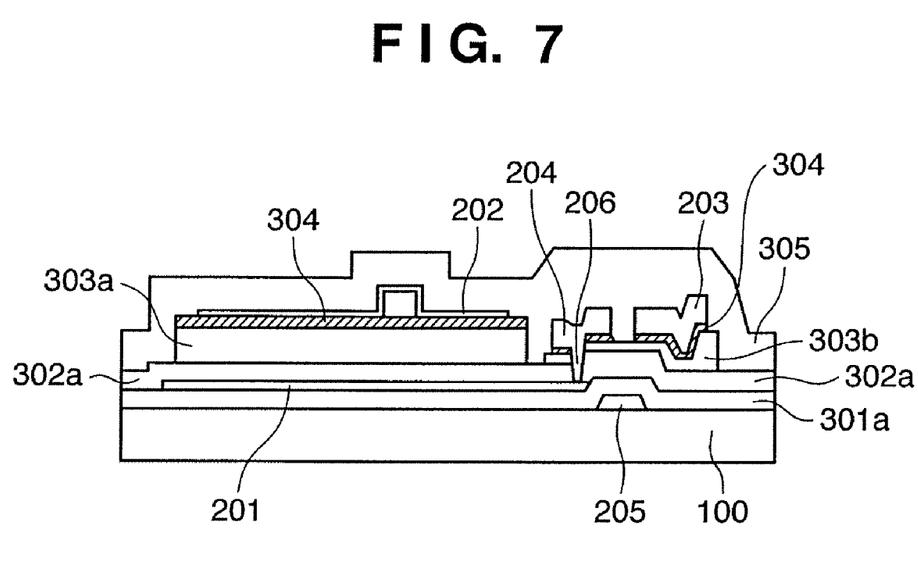
FIG. 7 is a schematic cross-sectional view along line F-F' of FIG. 6.

FIG. 7 is a schematic cross-sectional view along line F-F' of FIG. 6. The gate electrode 205 of the switching element 102 as illustrated in FIG. 7 is formed by the first metal layer, and the lower sensor electrode 201 of the conversion element 101 is formed by the second metal layer. The first metal layer is formed on the insulating substrate 100, and the first insulating layer 301a is arranged between the first metal layer and the second metal layer. As described, the gate line 103 and the gate electrode 205 are formed by a layer, which is different from that of the lower sensor electrode 201. Thus, both parts may be closely arranged so as not to overlap each other in the horizontal direction. For example, the size of the area of the conversion element 101 subjected to light or radiation can be increased to the degree that the space in the horizontal direction reaches substantially 0. In addition, since the gate line 103 and the gate electrode 205 are formed by a layer, which is different from that of the lower sensor electrode 201, for example, the gate line 103 and the gate electrode 205 are not shorted out due to particle adhesion during photolithography. Therefore, the yield is increased.

The schematic cross-sectional view of FIG. 7 differs from FIG. 3 in that a part of the semiconductor layer of the switching element 102, particularly the part located near the channel region is etched out. This structure increases the number of steps in photolithography due to the additional etching process. However, the thicknesses of the insulating layer and the semiconductor layer of the switching element 102 and the conversion element 101 can be optimized. For example, the film thickness of the semiconductor layer 303a is preferably thick, and that of the semiconductor layer 303b of the switching element 102 is preferably thin when possible, when the conversion element 101 converts visible light, particularly infrared light. In that case, the thicker semiconductor layer 303a of the conversion element 101 is formed, and the thinner semiconductor layer 303b of the switching element 102 is formed. This enables optimizing both structures. In the case that the MIS conversion element 101 converts, for example, a visible region into electric signals, the generated carriers can be read out at a high gain if the film thickness of the semiconductor layer 303a is thick. For example, it is preferable that the film thickness of the semiconductor layer 303a of the switching element 102 is thinner than that of the semiconductor layer 303a of the conversion element 101. Accordingly, high-performance imaging apparatus can be provided by optimizing both structures.

As described, it is preferable that the film thickness of the insulating layer of the conversion element 101 is thin. It is also preferable that the film thickness of the insulating layer of the switching element 102 is thick to ensure the insulation properties of the switching element 102 with a high operating bias and decrease the line capacitance. For example, it is preferable that the film thickness of the lower sensor electrode 201 of the conversion element 101 is thinly formed to be, for example, 10 nm-100 nm so as to thinly form the insulating layer of the conversion element 101 to be, for example, 30 nm-300 nm. In addition, it is preferable that the taper angle is controlled to be at a small degree ranging from 20° to 60° by dry etching in order to improve the film coverage of the second insulating layer 302a.

It is necessary to connect the gate line 103 to the leading line arranged at the periphery of the pixel region via the through hole arranged at the periphery of the pixel region in order to connect the gate line 103 to the driving circuitry 107. This connection can be achieved by forming the through hole concurrently at the periphery of the pixel region and performing overetching so as to perform etching to the first insulating layer 301a when forming the through hole 206 as illustrated in FIG. 3. Then, for example, the gate line 103 may be connected to the outgoing line formed by the third metal layer.

Fourth Embodiment

Figure 8:
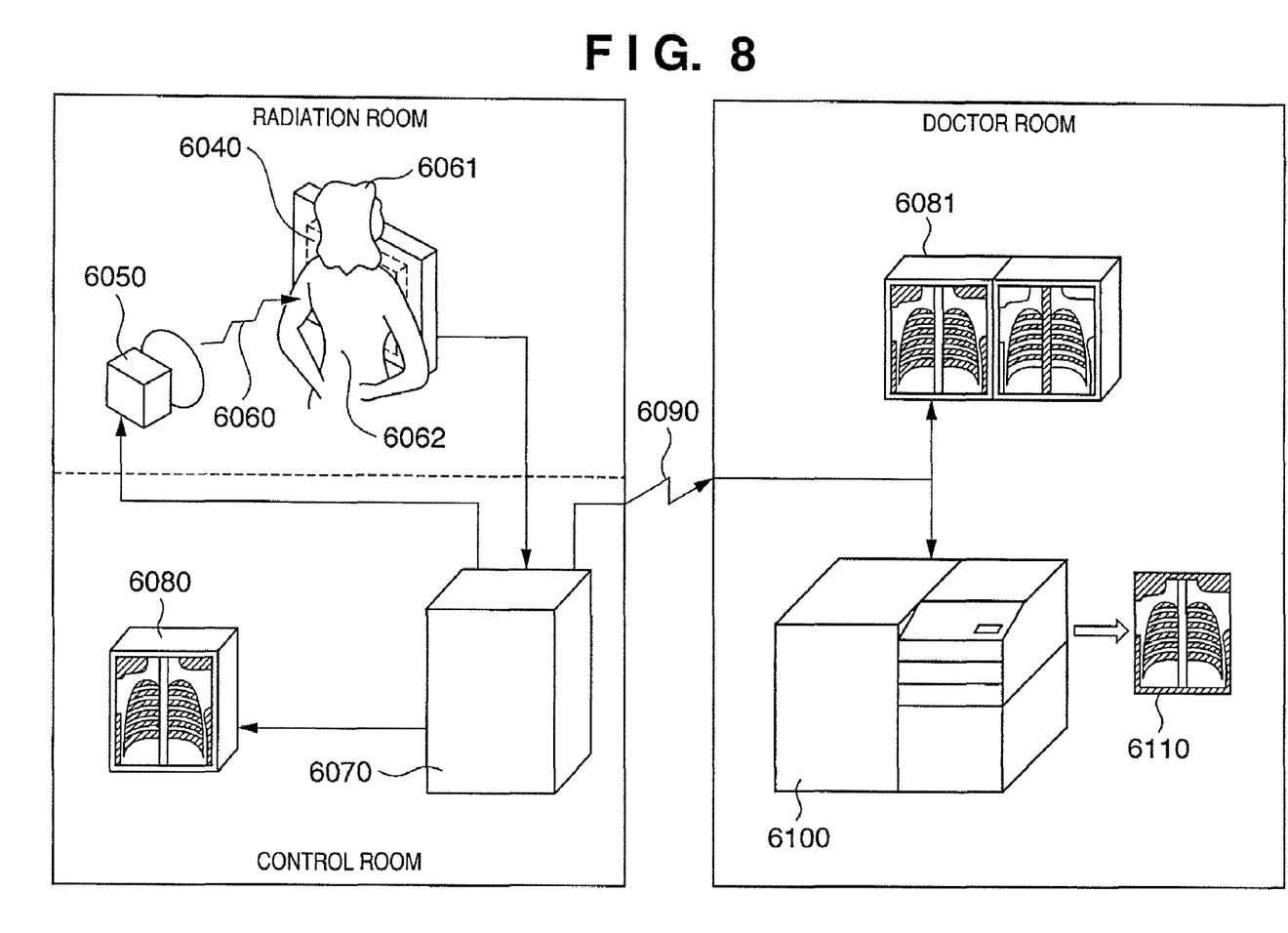
FIG. 8 is a schematic view of an imaging system using the conversion apparatus according to the preferred embodiments of the present invention.

FIG. 8 is a view of an imaging system using the conversion apparatus according to the preferred embodiment of the present invention to illustrate an exemplary structure of a radiation imaging system. Referring to FIG. 8, radiation 6060 such as X-rays generated by a radiation generation source 6050 is transmitted through the portion 6062 of the patient and incident on the radiation imaging apparatus 6040, which has the conversion apparatus according to the preferred embodiment of the present invention. The incident radiation includes information on the interior of the target object 6061. A scintillator, which is arranged on the side of radiation incidence in the conversion apparatus arranged in the radiation imaging apparatus 6040, emits light in response to the radiation incidence. The conversion apparatus obtains electric information by converting the emitted light into electrical signals. The electrical information is converted into a digital signal and image-processed by an image processor (a signal-processing unit) 6070 so that it can be monitored on the display (a display unit) 6080 in the control room. The electrical information can be transferred to a remote place through a transmitting unit 6090 such as a telephone line, and displayed on a display 6081 in a doctor room, which is different from the control room. The electrical information obtained in the doctor room can be stored on a storage medium such as an optical disk using a storage unit such as an optical disk apparatus, and thus a doctor at a remote place can make a diagnosis. Further, the electrical information can be stored on a film 6110 using a film processor 6100.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

This application claims the benefit of Japanese Patent Application No. 2006-161641, filed Jun. 9, 2006, which is hereby incorporated by reference herein in its entirety.

What is claimed is:

1. A conversion apparatus comprising:
   a pixel region, on a substrate, including a plurality of pixels arranged in a matrix, each pixel having a conversion element that converts radiation into electric charges and a switching element,
   wherein the switching element has a structure comprising a gate electrode, a first insulating layer, a second insulating layer and a semiconductor layer from the substrate side in this order, and
   the conversion element has an MIS-type structure comprising a bottom electrode arranged on an insulating layer extending from the first insulating layer of the switching element and being vertically higher than the gate electrode of the switching element, an insulating layer which is formed of the same layer as the second insulating layer of the switching element, and a semiconductor layer which is formed of the same layer as the semiconductor layer of the switching element from the substrate side in this order.

2. A conversion apparatus according to claim 1, wherein the gate electrode of the switching element and the bottom electrode of the conversion element are formed of different layers respectively.

3. A conversion apparatus according to claim 1, wherein a space between the gate electrode of the switching element and the bottom electrode of the conversion element in a horizontal direction is substantially 0.

4. A conversion apparatus according to claim 1, wherein the gate electrode of the switching element overlaps the bottom electrode of the conversion element in a horizontal direction.

5. A conversion apparatus according to claim 1, wherein a thickness of the second insulating layer is smaller than that of the first insulating layer.

6. A conversion apparatus according to claim 1, wherein the first insulating layer is formed at a lower temperature than that at which the second insulating layer is formed.

7. A conversion apparatus according to claim 1, wherein a thickness of the semiconductor layer of the switching element is smaller than that of the semiconductor layer of the conversion element.

8. A conversion apparatus according to claim 1, further comprising a scintillator that converts radiation into visible light at a radiation incident side of the conversion apparatus.

9. An imaging system comprising:
   a conversion apparatus as defined in claim 1;
   a signal-processing unit configured to process a signal from the conversion apparatus;
   a display unit configured to display a signal from the signal-processing unit; and
   a transmission-processing unit configured to transmit a signal from the signal-processing unit to the display unit.

* * * * *